(12) United States Patent
Ellis et al.

(10) Patent No.: US 8,996,942 B2
(45) Date of Patent: Mar. 31, 2015

(54) SUSPEND SDRAM REFRESH CYCLES DURING NORMAL DDR OPERATION

(71) Applicant: LSI Corporation, San Jose, CA (US)

(72) Inventors: Jackson L. Ellis, Fort Collins, CO (US); Shruti Sinha, Maharashtra (IN)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 67 days.

(21) Appl. No.: 13/778,636

(22) Filed: Feb. 27, 2013

(65) Prior Publication Data

US 2014/0177371 A1 Jun. 26, 2014

Related U.S. Application Data

(60) Provisional application No. 61/740,073, filed on Dec. 20, 2012.

(51) Int. Cl.
| | | |
|---|---|---|
| *G01R 31/28* | (2006.01) | |
| *G11C 7/10* | (2006.01) | |
| *G11C 11/406* | (2006.01) | |
| *G11C 11/4076* | (2006.01) | |
| *G11C 29/02* | (2006.01) | |
| *G11C 29/16* | (2006.01) | |
| *G11C 11/40* | (2006.01) | |

(52) U.S. Cl.
CPC ............ *G11C 7/1045* (2013.01); *G11C 11/406* (2013.01); *G11C 11/4076* (2013.01); *G11C 11/40* (2013.01); *G11C 29/023* (2013.01); *G11C 29/028* (2013.01); *G11C 29/16* (2013.01)
USPC .......................................................... 714/733

(58) Field of Classification Search
CPC .... G01R 31/3187; G11C 29/16; G11C 29/44; H05K 999/99; G06F 11/27
USPC .......................................................... 714/733
See application file for complete search history.

(56) References Cited

U.S. PATENT DOCUMENTS

| | | | | |
|---|---|---|---|---|
| 6,415,403 | B1 * | 7/2002 | Huang et al. .................. | 714/726 |
| 6,769,081 | B1 * | 7/2004 | Parulkar ........................ | 714/733 |
| 7,058,735 | B2 | 6/2006 | Spencer ......................... | 710/24 |
| 7,269,766 | B2 * | 9/2007 | Slobodnik et al. ............ | 714/718 |
| 7,661,050 | B2 * | 2/2010 | Huben et al. .................. | 714/733 |
| 7,793,008 | B2 | 9/2010 | Hammitt et al. .................. | 710/8 |
| 7,793,175 | B1 | 9/2010 | Swarnkar et al. ............. | 714/718 |
| 7,849,345 | B1 | 12/2010 | Swarnkar et al. ............. | 713/401 |
| 7,971,111 | B1 | 6/2011 | Swarnkar et al. ............. | 714/718 |
| 8,456,934 | B2 * | 6/2013 | Best et al. ...................... | 365/200 |
| 2004/0107396 | A1 * | 6/2004 | Barone et al. ................. | 714/733 |

FOREIGN PATENT DOCUMENTS

| | | | | |
|---|---|---|---|---|
| WO | WO2013147844 A1 * | 10/2013 | | |
| WO | WO 2013147844 A1 * | 10/2013 | ............. | G11C 29/12 |

* cited by examiner

*Primary Examiner* — Albert Decady
*Assistant Examiner* — Enam Ahmed
(74) *Attorney, Agent, or Firm* — Christopher P. Maiorana, PC

(57) ABSTRACT

An apparatus comprising a test circuit and a protocol circuit. The test circuit may be configured to generate a plurality of control signals in response to one or more read data signals. The protocol circuit may be configured to generate a plurality of interface signals in response to the plurality of control signals. The protocol engine suspends a refresh operation during a normal operation of the apparatus.

20 Claims, 4 Drawing Sheets

SUSPEND SDRAM REFRESH CYCLES DURING NORMAL DDR OPERATION

This application claims the benefit of U.S. Provisional Application No. 61/740,073, filed Dec. 20, 2012, and is hereby incorporated by reference in its entirety.

FIELD OF THE INVENTION

The present invention relates to memory circuits generally and, more particularly, to a method and/or apparatus for implementing suspend SDRAM refresh cycles during normal DDR operation of an SDRAM.

BACKGROUND OF THE INVENTION

In conventional memory configurations, each data bit in a DRAM cell is stored in a capacitor. Due to leakage, such capacitors leak charge over a period of time. Periodic refreshes are used to charge the capacitors and to restore the data. In a typical 512 Mb double data rate (DDR) memory with 8192 rows, an AUTO REFRESH command is issued every 7.8 us. With such timing, each row is refreshed at least once every 64 ms. The refresh generation logic is a part of the memory controller that issues refresh cycles to the SDRAM once every refresh timing interval (trfi).

It would be desirable to implement a protocol engine that suspends SDRAM refresh cycles during normal DDR operation.

SUMMARY OF THE INVENTION

The present invention concerns an apparatus comprising a built in self test (BIST) engine and a protocol engine. The built in self test (BIST) engine may be configured to generate a plurality of control signals in response to one or more read data signals. The protocol engine may be configured to generate a plurality of interface signals in response to the plurality of control signals. The protocol engine suspends a refresh operation during a normal operation of the apparatus.

The features and advantages of the present invention include providing a circuit that may (i) suspend SDRAM refresh cycles during normal DDR operation, (ii) implement a state machine to switch between states, (iii) operate in an SDRAM controller, and/or (iv) be easy to implement.

BRIEF DESCRIPTION OF THE DRAWINGS

These and other features and advantages of the present invention will be apparent from the following detailed description and the appended claims and drawings in which:

DETAILED DESCRIPTION OF THE PREFERRED EMBODIMENTS

Figure 1:
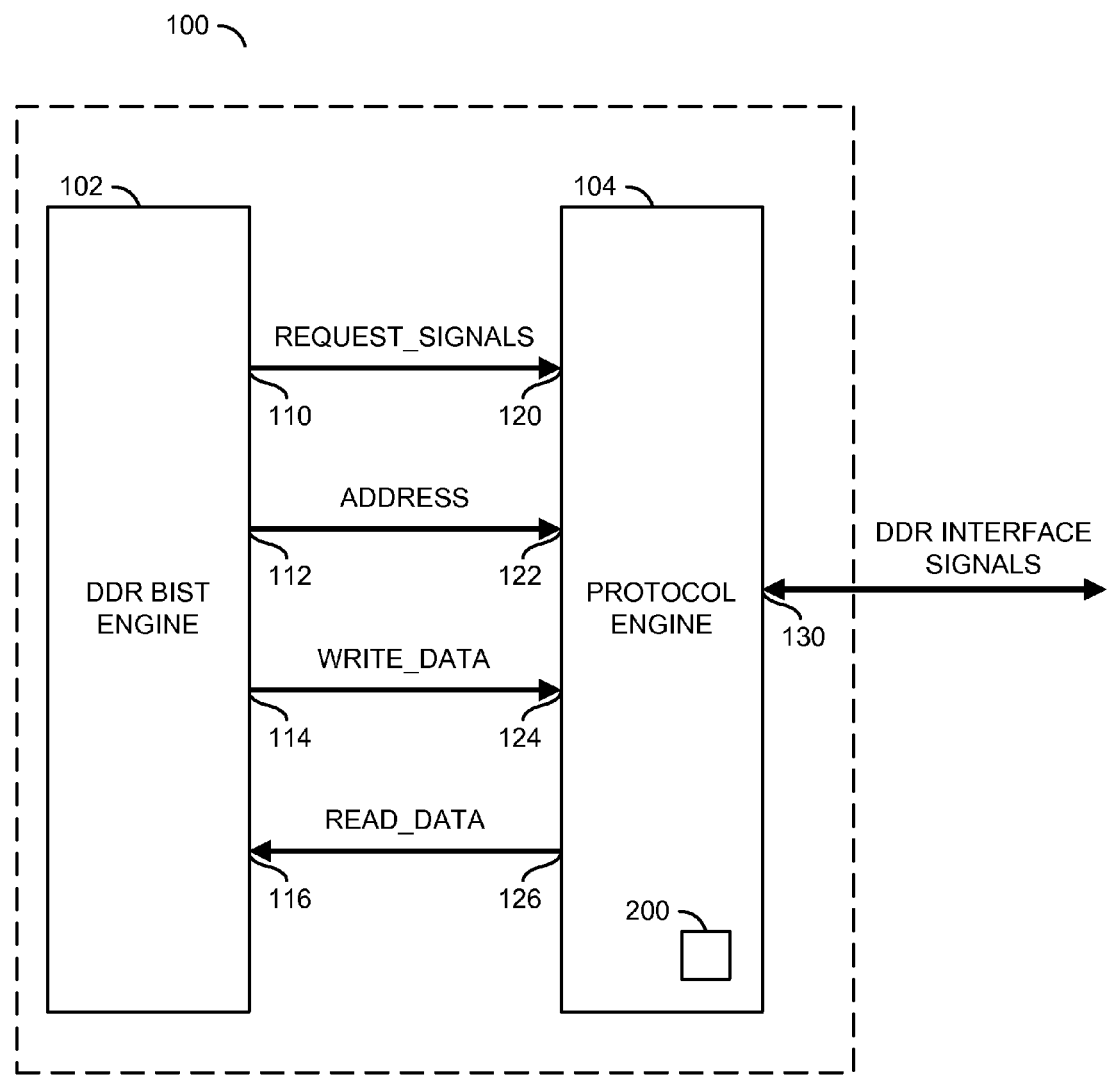
FIG. 1 is a block diagram of a Double Data Rate (DDR) Built in Self Test (BIST) Controller in accordance with an embodiment of the present invention.

Referring to FIG. 1, a block diagram of a circuit 100 is shown in accordance with an embodiment of the present invention. The circuit 100 generally comprises a block (or circuit) 102 and a block (or circuit) 104. The circuit 100 may be implemented as a DDR BIST controller. The circuit 102 may have an output 110 that may present a signal (e.g., REQUEST_SIGNALS), an output 112 that may present a signal (e.g., ADDRESS), an output 114 that may present a signal (e.g., WRITE_DATA) and an input 116 that may receive a signal (e.g., READ_DATA). The circuit 104 may have an input 120 that may receive the signal REQUEST_SIGNALS, an input 122 that may receive the signal ADDRESS, an input 124 that may receive the signal WRITE_DATA and an output 126 that may present the signal READ_DATA. The circuit 104 may also have an input/output 130 that may present/receive one or more DDR interface signals.

The DDR interface signals may be connected to a physical memory (e.g., a SDRAM, not shown in FIG. 1). The circuit 104 may include a state machine 200. While an SDRAM memory has been described, the particular type of memory implemented may be varied to meet the design criteria of a particular implementation. Additionally, while double data rate interface signals have been described, the particular type of DDR interface signals (e.g., the particular version, such as 1.0, 2.0, 3.0, etc.) may be varied to meet the design criteria of a particular implementation. The protocol engine 104 may work together with the BIST engine 102 to take control of generating AUTO REFRESH commands.

Figure 2:
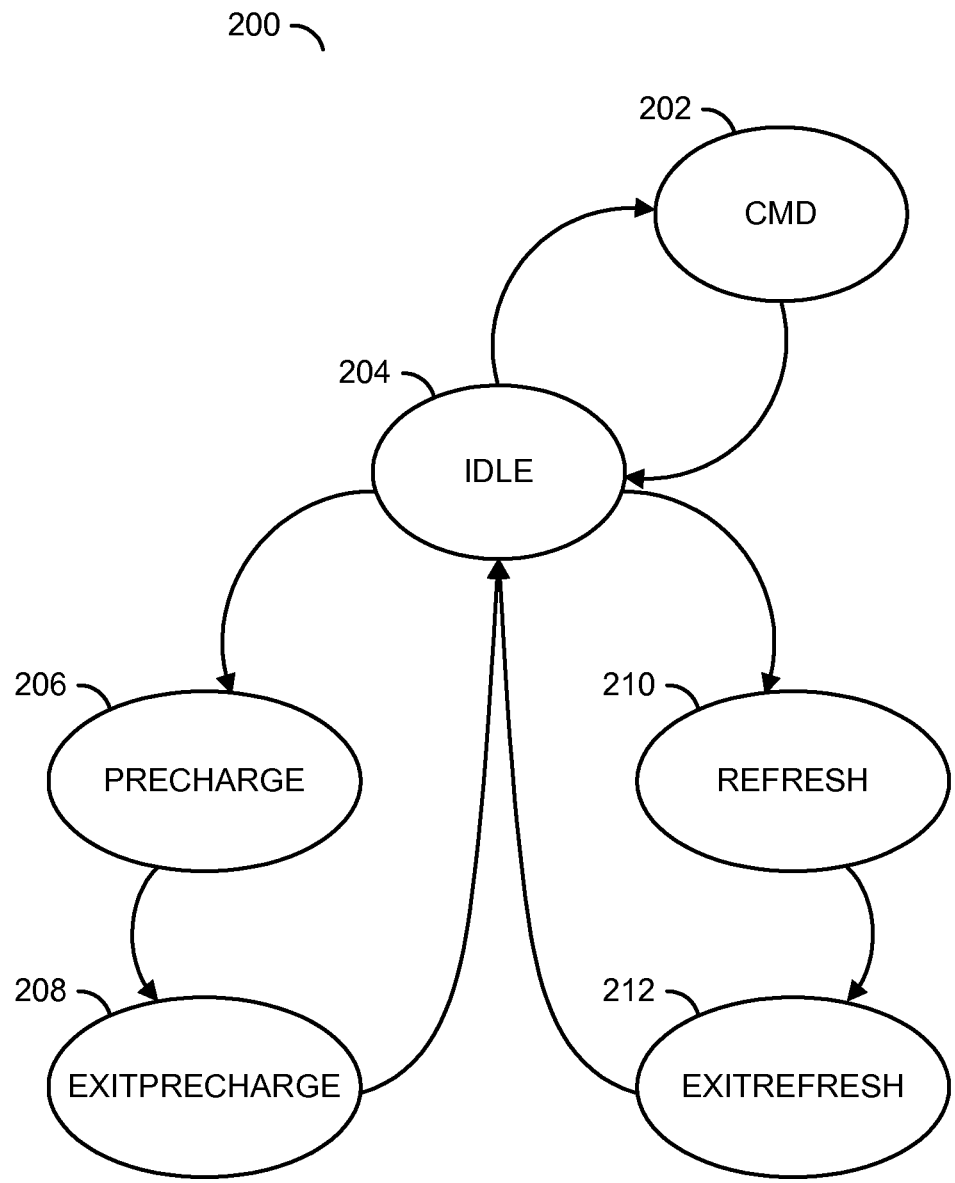
FIG. 2 is a state diagram of the circuit of FIG. 1 illustrating the Double Data Rate (DDR) Command States in the circuit of FIG. 1.

Referring to FIG. 2, a diagram of the state machine 200 is shown. The state machine 200 generally comprises a step (or state) 202, a step (or state) 204, a step (or state) 206, a step (or state) 208, a step (or state) 210 and a step (or state) 212. The state 202 may be a command state. The state 204 may be an idle state. The state 206 may be a precharge state. The state 208 may be an exit precharge state. The state 210 may be a refresh state. The state 212 may be an exit refresh state.

The DDR BIST controller circuit 100 may be used as a test engine for SDRAM memory. The circuit 100 includes the BIST engine 102 and the protocol engine 104 that interfaces with the SDRAM memory and controls the normal memory operation.

The BIST engine circuit 102 uses different types of test patterns such as all R/W, data retention and/or march pattern to test the SDRAM over the complete address range. The BIST engine circuit 102 generates the address, and/or read/write command along with few request signals to the protocol engine 104. The protocol engine 104 takes the information from the BIST engine 102 and generates the SDRAM interface signals needed for testing.

The protocol engine 104 may issue DDR commands based on the status of the state machine 200. In one example, the state machine 200 may have 6 states. Switching between the states may occur based on the particular value of the signal REQUEST_SIGNALS received from the BIST Engine circuit 102.

Initially, the state machine 200 is in the IDLE state 204. When a write/read command is requested by the BIST engine circuit 102, the state machine 200 goes into the CMD state 202. The state machine 200 goes into the PRECHARGE state 206 when precharge is requested. Once the precharge command 206 is issued to the DDR, after the minimum precharge time (e.g., tRP), the state machine 200 goes back to the IDLE state 204. The standard refresh generation logic generates a refresh request every 7.8 us. All banks of the SDRAM should be precharged and be in the IDLE state 204 for at least the precharge time (tRP) before refresh cycles are issued.

On a refresh request, the state machine 200 first goes into IDLE state 204, and then transitions to the REFRESH state 210. After the refresh cycle interval (e.g., trfc period), the state machine 200 moves back to the IDLE state 204 from the EXITREFRESH state 212.

In one example, the refresh issued to the DDR may be firmware that generates the refresh as needed. Another mode of refresh generation is through hardware where periodic refresh requests are given to the DDR. Each time the configuration bit is set, a refresh cycle is issued to the DDR. However, the user does not have the control of suspending the refresh for some time while the memory continues with the normal read/write operation. The suspend operation is controlled internally by the BIST engine circuit 102 during testing (e.g., during a Static Data Retention Test). Such tests validate the data retention time when DDR is not refreshed periodically. During such tests, the BIST engine 102 waits for a refresh to occur, then pauses the refresh generation until a command is given to resume the refresh operation. This is controlled by a signal APP_PAUSE_REFR_REQ and a signal APP_PAUSE_REFR_ACK that are interfaced to the protocol engine 104 (to be described in more detail in connection with FIG. 3).

Figure 3:
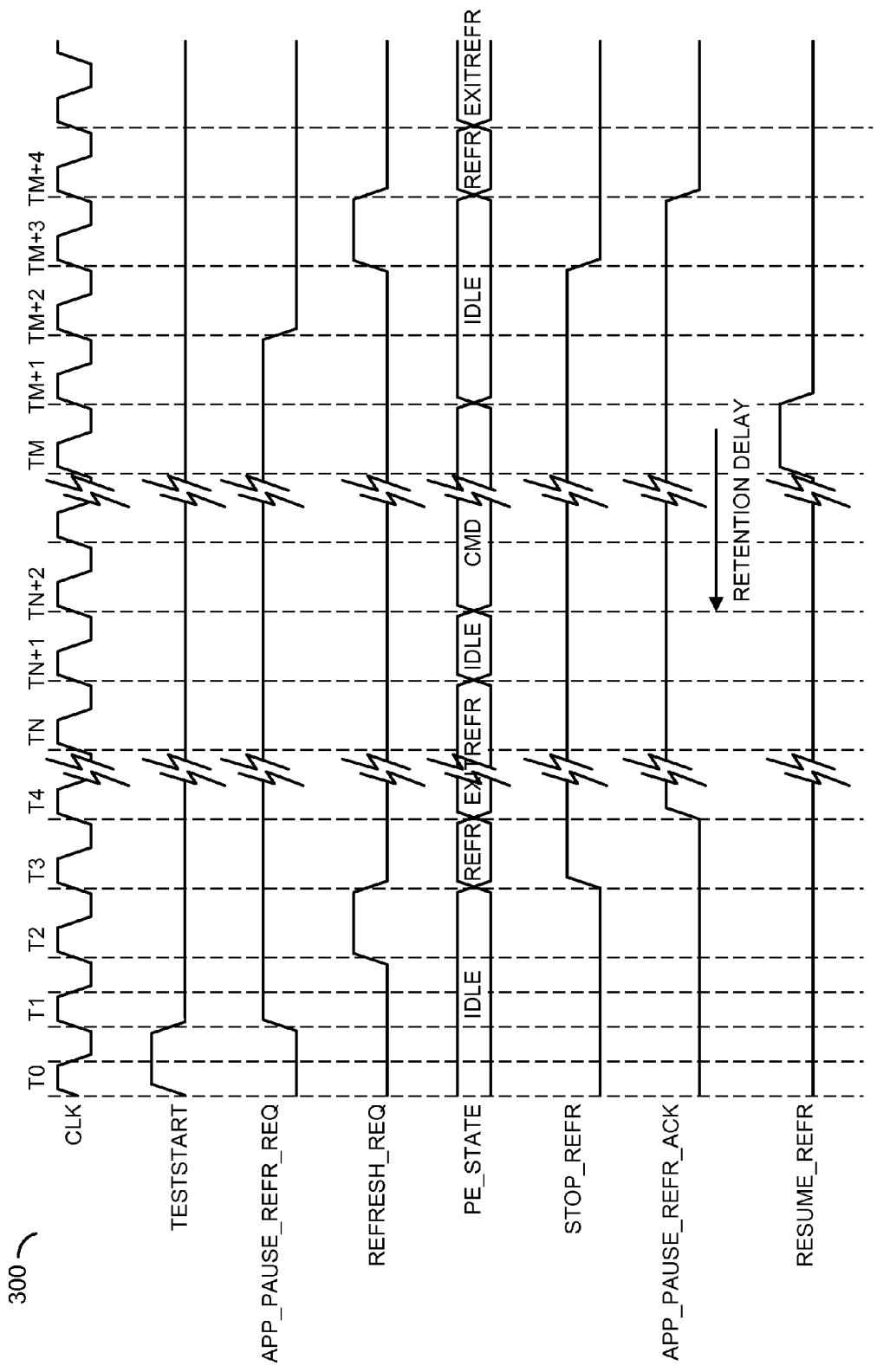
FIG. 3 is a timing diagram illustrating an example command sequence in accordance with suspend refresh operation.

Referring to FIG. 3, a timing diagram 300 of various waveforms is shown. The timing diagram 300 generally comprises a number of signals (e.g., CLK, TESTSTART, APP_PAUSE_REFR_REQ, REFRESH_REQ, PE_STATE, STOP_REFR, APP_PAUSE_REFR_ACK and RESUME_REFR). When a test, such as static data retention test, begins, the signal TESTSTART is asserted. Another signal APP_PAUSE_REFR_REQ transitions high. The protocol engine 104 checks for the signal APP_PAUSE_REFR_REQ from the BIST Engine circuit 102 and an internal condition of the signal PE_STATE. If the signal PE_STATE is in the refresh state 210, and the signal APP_PAUSE_REFR_REQ is high, then the signal STOP_REFR gets asserted. The assertion of the signal STOP_REFR indicates to the Protocol Engine circuit 104 that no additional refresh cycles will be generated until the signal RESUME_REFR is not asserted.

After the AUTO REFRESH command period (tRFC) (e.g., TN-T4), the signal PE_STATE transitions to the IDLE state 204 for one clock, then to the CMD state 202 to allow DDR writes. Once the DDR write pass is completed, the test then waits for programmed cycles of retention delay, then performs the read operation. Once the read pass is complete, the refresh cycle is resumed by asserting the signal RESUME_REFR. The signal PE_STATE goes back into the IDLE state 204 and the signal REFRESH_REQ goes high for one clock. Refresh cycles are resumed as in the normal operation.

Figure 4:
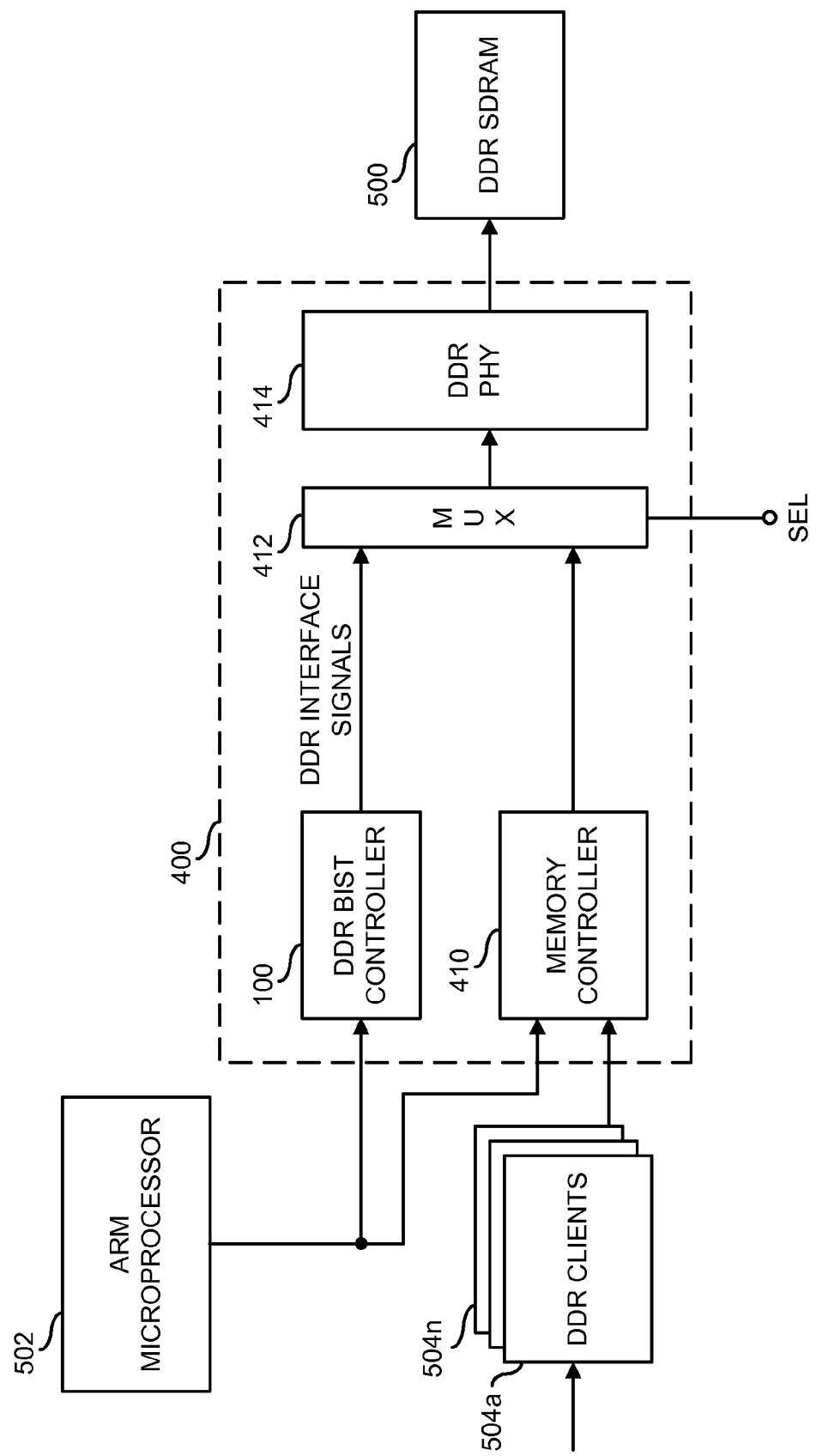
FIG. 4 is a diagram illustrating the controller in the context of a memory.

Referring to FIG. 4, a diagram of a controller 400 is shown connected to a memory 500. In one example, the memory 500 may be implemented as a random access memory (RAM). However, the particular type of memory implemented may be varied to meet the design criteria of a particular implementation. The controller 400 may include the BIST controller 100, and a memory controller 410. The controller 400 may also include a multiplexer 412 and a block (or circuit) 414. The circuit 414 may be implemented as a DDR PHY circuit. The multiplexer 412 may select between the controller 100 and the controller 410. The controller 400 may connect a block (or circuit) 502 and a number of blocks (or circuits) 504a-504n, to the memory 500. In the example shown, the circuits 504a-504n may be connected directly to the controller 410. The processor 502 may be connected to both the controller 100 and the controller 410. In one example, the circuit 502 may be implemented as an ARM microprocessor. However, other types of circuits may be implemented to meet the design criteria of a particular implementation.

By performing a static data retention test on the SDRAM, data integrity can be validated by suspending the refresh for a configured amount of retention delay and then resuming back to the normal AUTO REFRESH cycles. The controller 100 may be used to test a system implementing the memory 500. The controller 100 includes the protocol engine 104 that supports a variety of memory protocols (e.g., DDR1, DDR2, DDR3, etc.). The controller 100 includes several R/W and/or march pattern generators. The controller 100 checks for errors on read operations and logs the result in a log register file. The controller may be located on the APB interface. The processor 502 may (i) configure the particular test to be run, (ii) indicate when to start the test(s), (iii) poll for completion, and/or (iv) check the result.

The controller 100 interfaces to the DDR Phy circuit 414 through the multiplexer 412. The multiplexer 412 may select either the external memory controller 410 or the DDR BIST controller 100. In one example, the DDR PHY circuit may be implemented as a hardmacro memory PHY, such as a DDR1/2 or a DDR2/3 PHY circuit. The DDR PHY circuit 414 and the DDR I/O pads (not shown) may manage the inter-signal skew and/or timing to the memory 500. The DDR Phy circuit 414 may include support for DQS and/or read gate training.

The BIST Engine 102 may generate various memory test patterns, such as checkerboard, write/read address, and/or march patterns. Each pattern includes a sub-module for generating requests, address, and/or data. The request generation includes a control for opening and closing DDR device rows, sequencing between read and write requests, and determining when to start and stop the transfer. Address generation may either be sequential or may follow a march pattern. Address ranges may be specified for the area within the memory device 500 to be tested. Data generation can specify a data pattern and/or how to vary the pattern during the memory test. The data generation supplies the data to the protocol engine circuit 104 on writes and/or checks the data from the protocol engine circuit 104 on reads. The address and/or request generation units provide the requests and addresses to the protocol engine circuit 104 on both writes and reads. A 16-deep register file may be used to capture the first 16 error locations and/or the number of bits in error that are found during each test run. The total error bits register indicates the total number of bits found in error during the test. The registers in the BIST engine circuit 102 are for configuring the particular memory tests to be performed, starting the test, polling for completion, and then reading the results of the tests. The registers may be accessed using an APB interface on the DBC.

The protocol engine interface circuit 104 implements a DDR1, DDR2, and/or DDR3 protocol compliant with the appropriate JEDEC standards. The protocol engine 104 may use many programmable parameters to allow support for the full JEDEC range of devices. The protocol engine 104 may allow the option for firmware to drive the DDR initialization sequence and then to turn control over to the BIST engine circuit 102. The protocol engine circuit 104 will provide periodic refreshes when enabled. The protocol engine circuit 104 may support a prefetch low-power mode as an automatic hardware initiated mode and/or self-refresh low-power mode as a firmware initiated mode. The protocol engine circuit 104 can perform multiple writes and/or reads within the same DDR row with only one activate and precharge for optimal performance during both the sequential and march pattern tests. The protocol engine circuit 104 may support the full range of DDR1, DDR2, and/or DDR3 JEDEC supported sizes. The multiplexor 412 can switch between the controller 100 and the external memory controller 410 for a connection to the DDR PHY circuit 414. A select signal SEL can only be changed (or acknowledged) when the DDR is in self-refresh mode. The multiplexer 412 may be implemented within a synchronous path so that no glitches will occur to the DDR PHY circuit 414 during a switch. After a switch of the multiplexer 412, the selected device (100 or 410) can exit self-refresh mode and/or begin memory transfers to the DDR PHY. The APB3 register interfaces allows the DBC module to operate on an ARM APB3 bus for accessing registers within the controller 100.

The functions performed by the diagram of FIG. 2 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
 a built in self test (BIST) engine configured to generate a plurality of control signals in response to one or more read data signals; and
 a protocol engine configured to generate a plurality of interface signals in response to said plurality of control signals, wherein (A) said protocol engine suspends a refresh operation of a memory during a data integrity validation operation initiated by said built in self test engine, (B) said protocol engine comprises a state machine configured to switch between a plurality of states based upon a particular combination of requests received from said built in self test engine, and (C) a multiplexor circuit is configured to switch between (i) said apparatus and (ii) an external memory controller prior to addressing said memory.

2. The apparatus according to claim 1, wherein said multiplexor (i) presents said plurality of control signals from said apparatus or a second plurality of control signals from said external memory controller and (ii) said switch occurs during a self refresh mode.

3. The apparatus according to claim 2, wherein said plurality of states include an idle state, a command state, a pre-charge state, and a refresh state.

4. The apparatus according to claim 1, wherein said apparatus is implemented as a controller of said memory.

5. The apparatus according to claim 4, wherein (i) said memory comprises an SDRAM module and (ii) said interface signals are presented to said SDRAM module.

6. The apparatus according to claim 5, wherein said SDRAM module comprises a double data rate (DDR) SDRAM.

7. The apparatus according to claim 1, wherein said built in self test engine comprises a built-in self test (BIST) double data rate (DDR) circuit.

8. An apparatus comprising:
 means for generating a plurality of control signals in response to one or more read data signals; and
 means for generating a plurality of interface signals in response to said plurality of control signals, wherein (A) said apparatus suspends a refresh operation of a memory during a data integrity validation operation initiated by said apparatus, (B) said means for generating said interface signals switches between a plurality of states based upon a particular combination of requests received from said means for generating said control signals, and (C) a multiplexor is configured to switch between (i) said apparatus and (ii) an external memory controller prior to addressing said memory.

9. A method for implementing a controller in a memory, comprising the steps of:
 (A) generating a plurality of control signals in response to one or more read data signals; and
 (B) generating a plurality of interface signals in response to said plurality of control signals, wherein (a) said method suspends a refresh operation of said memory during a data integrity validation operation initiated by a built in self test engine, (b) step (B) includes implementing a state machine to switch between a plurality of states based upon a particular combination of requests received from step (B) and (c) switching between (i) said control with steps (A) and (B) and (ii) control using an external memory controller prior to addressing said memory.

10. The apparatus according to claim 1, wherein said data integrity validation operation is performed during a normal operation of said apparatus.

11. The apparatus according to claim 1, wherein said BIST engine and said protocol engine take control of generating auto refresh commands.

12. The apparatus according to claim 1, wherein said data integrity validation operation comprises checkerboard, write/read address, data retention and march patterns of said memory.

13. The apparatus according to claim 1, wherein said multiplexor selects between said apparatus and said memory controller during a self refresh mode.

14. The apparatus according to claim 13, wherein a processor is connected to both said apparatus and said memory controller.

15. The apparatus according to claim 14, wherein said processor is implemented as an ARM microprocessor.

16. The apparatus according to claim 14, wherein said processor (i) configures a particular one of said data integrity validation operations to run, (ii) indicates when to start said data integrity validation operation, (iii) polls for completion of said data integrity validation operations and (iv) checks a result of said data integrity validation operation.

17. The apparatus according to claim 13, wherein said multiplexor is further configured a receive a select signal configured to be acknowledged during a self-refresh mode of said memory.

18. The apparatus according to claim 1, wherein said data validation operation is configured to check for errors on read operations and log results in a log register file.

19. The apparatus according to claim 8, wherein said memory comprises an SDRAM.

20. The method according to claim 9, wherein said memory comprises an SDRAM.

* * * * *